United States Patent [19]
Bradley et al.

[11] Patent Number: 5,273,438
[45] Date of Patent: Dec. 28, 1993

[54] CANTED COIL SPRING ARRAY AND METHOD FOR PRODUCING THE SAME

[75] Inventors: Morgan J. Bradley, Harrisburg; George R. Schmedding, Hummelstown; Richard A. Stuckey, Annville, all of Pa.

[73] Assignee: The Whitaker Corporation, Wilmington, Del.

[21] Appl. No.: 932,406

[22] Filed: Aug. 19, 1992

[51] Int. Cl.⁵ ............................................. H01R 9/09
[52] U.S. Cl. .................................. 439/66; 29/884; 439/591
[58] Field of Search .................... 439/66, 74, 91, 591; 29/876, 884

[56] References Cited

U.S. PATENT DOCUMENTS

| | | | |
|---|---|---|---|
| 3,795,884 | 3/1974 | Kotaka | 339/17 LM |
| 3,985,413 | 10/1976 | Evans | 339/17 LM |
| 4,421,370 | 12/1983 | Treakle et al. | 439/66 |
| 4,655,462 | 4/1987 | Balsells | 277/164 |
| 5,030,109 | 7/1991 | Dery | 439/66 |

*Primary Examiner*—Neil Abrams
*Attorney, Agent, or Firm*—William B. Noll

[57] ABSTRACT

An apparatus (25) and method for loading elliptically cross-sectioned canted contact springs (11) on to respective rows of U-shaped tabs (18) lanced out of a continuous strip (17) of relatively-thin flexible material.

3 Claims, 10 Drawing Sheets

CANTED COIL SPRING ARRAY AND METHOD FOR PRODUCING THE SAME

FIELD OF THE INVENTION

The present invention relates to an apparatus and method for producing and assembling a canted coil spring array, and more particularly, to a canted coil spring array suitable for making electrical connections between respective circuit elements on a pair of electrical or electronic assemblies as, for example, a connector and a disk drive.

BACKGROUND OF THE INVENTION

Canted coil springs have been used for making electrical connections between a pair of spaced-apart substrates. The canted coil springs have an elliptical cross-section including a major axis and a minor axis. These canted coil spring contacts are quite small and preferably (but not necessarily) the springs are compressed in a direction which is perpendicular to the major axis of the ellipse, as the desired electrical connection is made.

Such an arrangement is disclosed and claimed in U.S. Pat. No. 5,030,109 assigned to the assignee of the present invention. In this '109 patent, an area array connector includes a carrier plate having openings formed therein for receiving respective canted coil spring contacts.

Other prior art, of which we are aware, are the following U.S. Pat. Nos. 3,795,884; 3,985,413; and 4,655,462.

SUMMARY OF THE INVENTION

The present invention provides an apparatus and method for producing and assembling a canted coil spring array which eliminates difficult molding techniques, simplifies the assembly, and is readily adaptable to low-cost automated manufacture.

In accordance with the teachings of the present invention, there is disclosed a preferred method for producing and assembling a canted coil spring array. The improved method includes the step of providing a substantially-flat sheet of relatively-thin flexible material having electrical insulation qualities. At least one tab is lanced out of the sheet; and the tab and sheet are moved relative to each other, such that the tab is accessible relative to the sheet. A canted coil spring is provided, and the spring is fed on to the tab on the sheet. Thereafter, the tab with the spring mounted thereon is returned substantially into the plane of the sheet.

Preferably, the sheet is passed over a radiused surface to push the sheet away from the tab, and the lanced-out tabs are substantially U-shaped.

DESCRIPTION OF THE PREFERRED EMBODIMENTS

Figure 1:
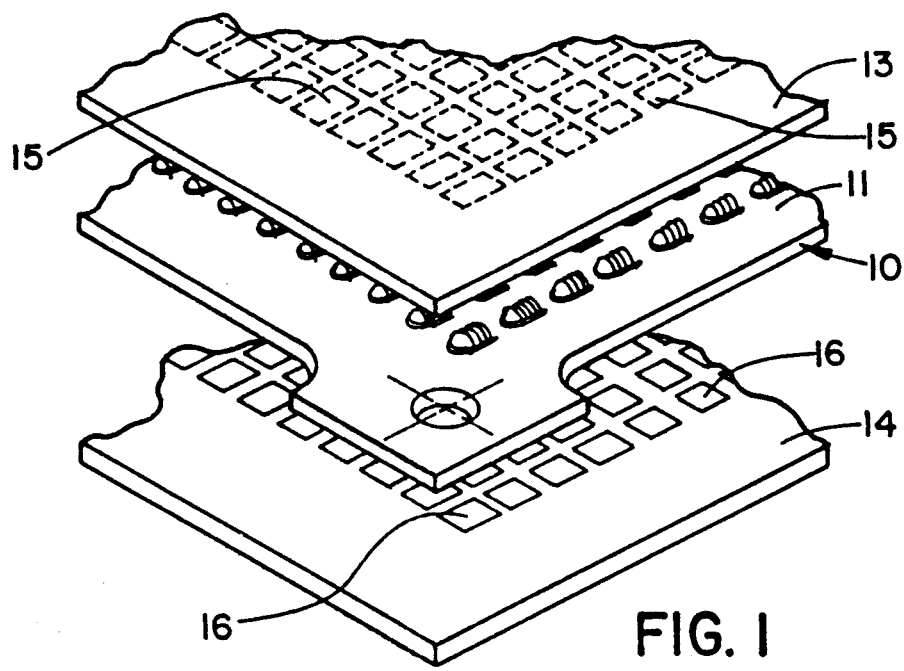
FIG. 1 is an exploded perspective of a connector having a plurality of canted coil spring contacts mounted on respective tabs on the connector, the springs and tabs being arranged in respective rows, and the connector being adapted to make electrical connection between adjacent substrates or members, such as a pair of PC boards, having respective circuit elements carried thereon.
Figure 2:
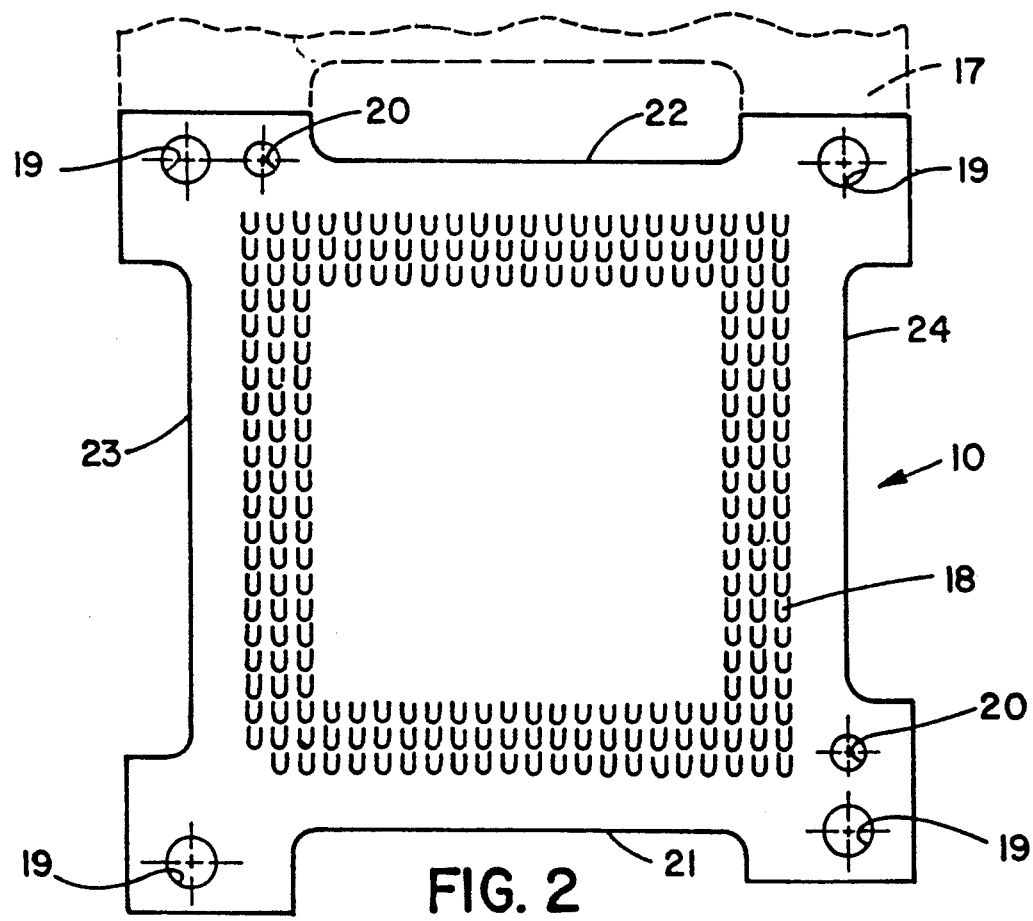
FIG. 2 is a top plan view of the connector, drawn to an enlarged scale and having a substantially plan outline, the spring contacts being removed for ease of illustration.
Figure 3:
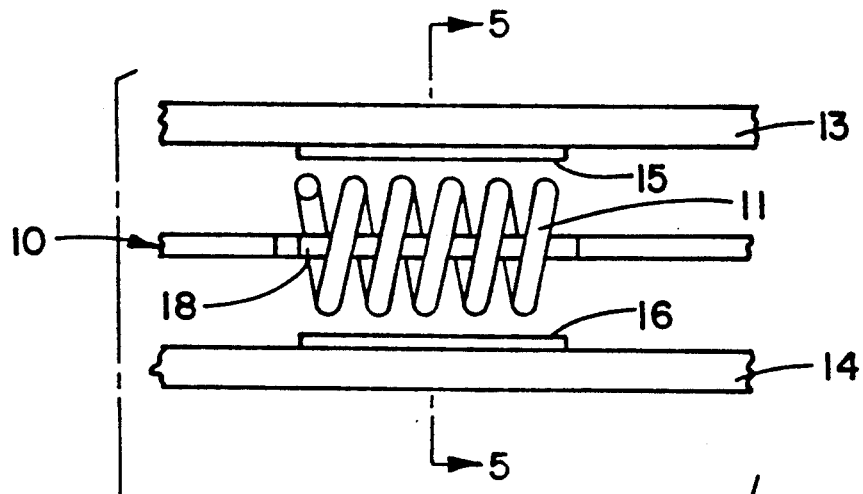
FIG. 3 is a section view of one of the canted coil spring contacts mounted on its respective tab on the connector, the view further showing the two PC boards in exploded relationship to the spring and tab.
Figure 4:
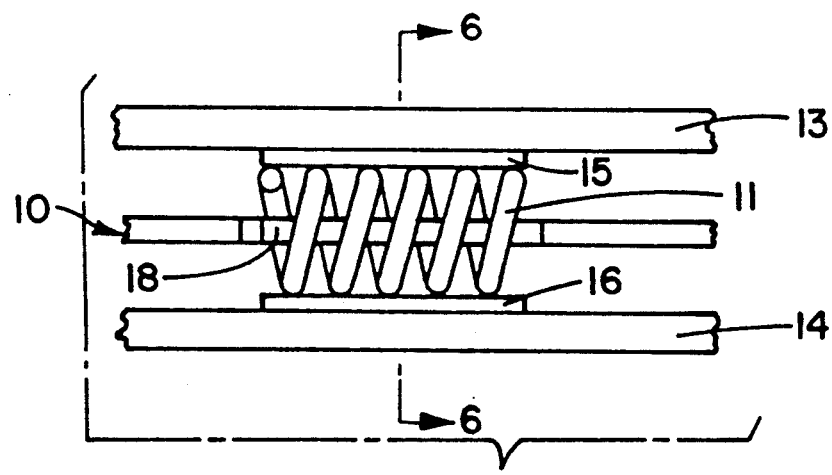
FIG. 4 corresponds substantially to that of FIG. 3 but shows the PC boards secured together to compress the spring contact therebetween, thereby making electrical connection between the respective circuit elements on the PC boards.
Figure 5:
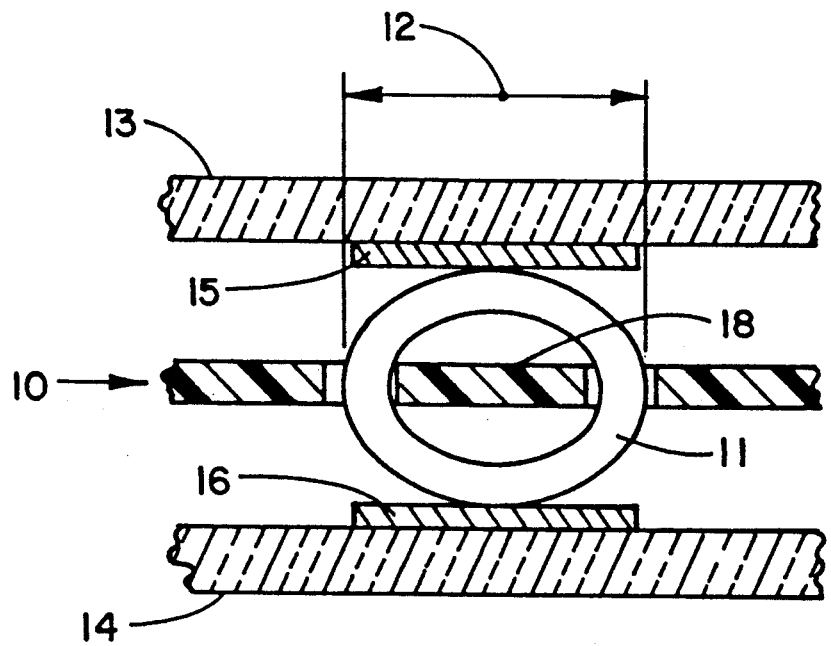
FIG. 5 is a cross-sectional view, taken along the lines 5—5 of FIG. 3, and showing the elliptical cross section of the canted coil spring, the major axis of the ellipse being disposed substantially in a plane of the tab.
Figure 6:
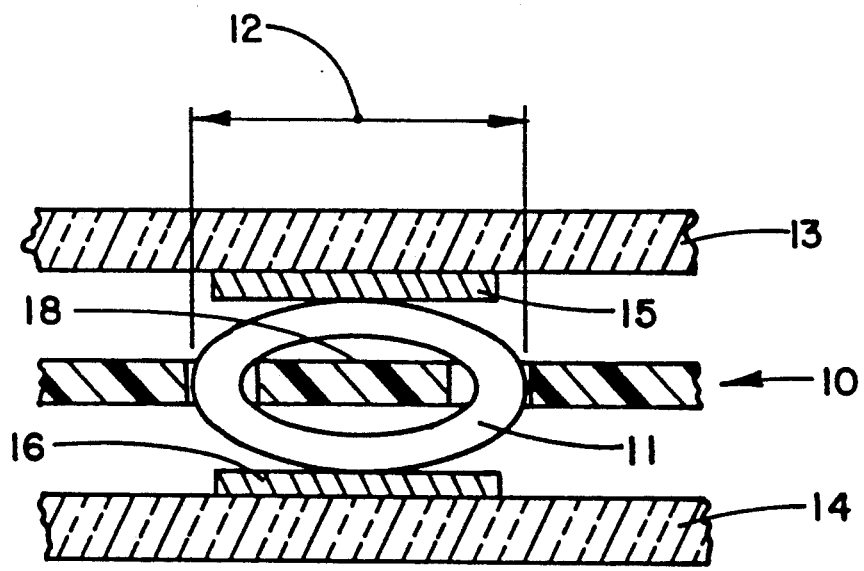
FIG. 6 is a cross-sectional view, taken along the lines 6—6 of FIG. 4 and corresponding substantially to that of FIG. 5, but showing the spring contact compressed in making the electrical connection.
Figure 7:
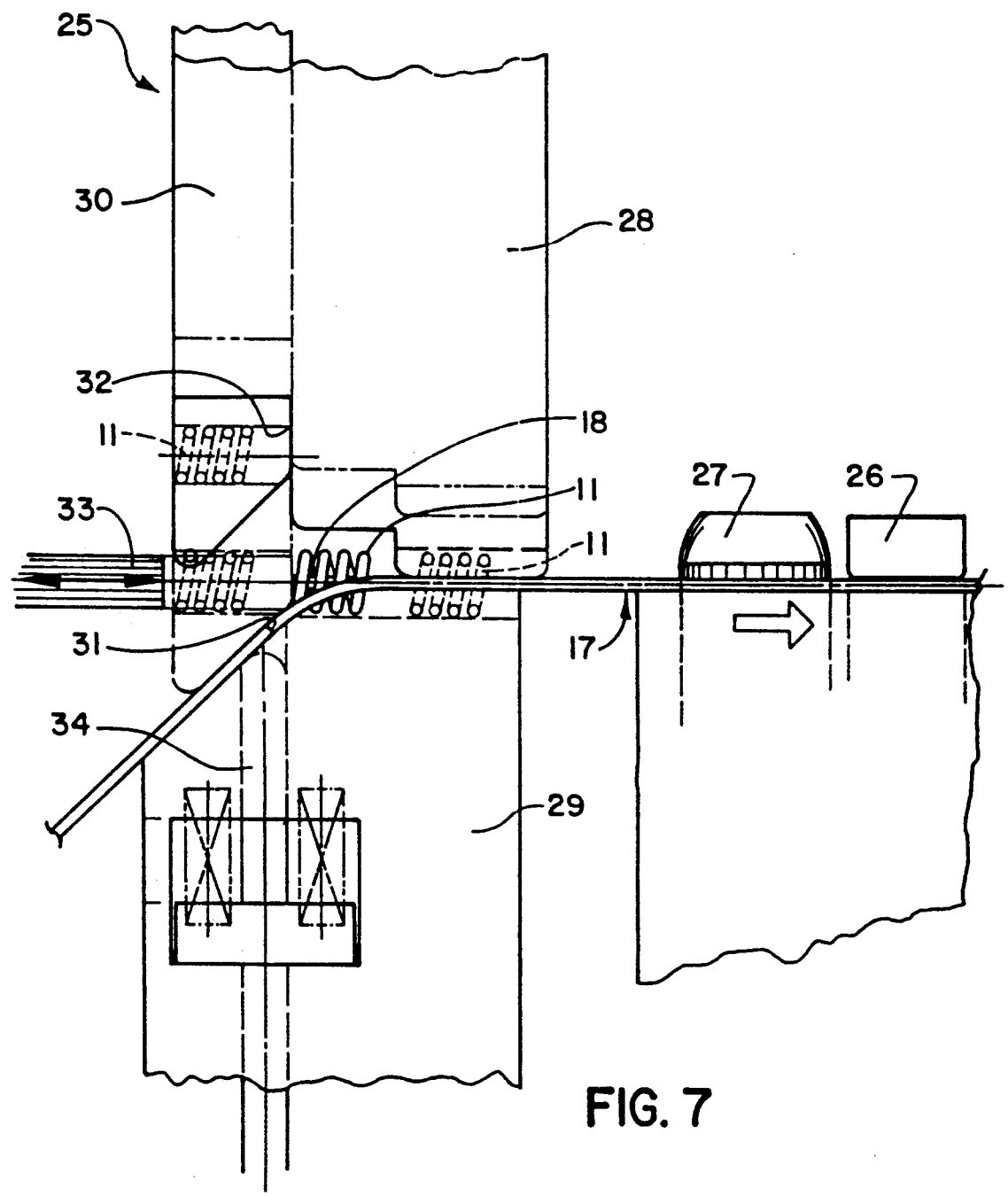
FIG. 7 is a side elevation of the preferred embodiment of an apparatus for inserting a spring contact on a respective lanced-out tab on the connector.

With reference to FIGS. 1 and 2, there is shown a connector 10 having a plurality of spring contacts 11 mounted thereon. In a preferred embodiment, the connector 10 is substantially in the form of a square, the size of the connector 10 is around 1.5 inches square, and there are 227 spring contacts 11 on the connector 10.

The connector 10 is made from a sheet or strip of relatively-thin plastic material having a thickness in the range of 0.005–0.008 inch and, preferably, a material sold by DuPont Company under its trademark "KAPTON". It will be appreciated, however, that any suitable material may be used, even a conductive material coated with an insulation.

The canted coil spring contacts 11 are cut from lengths of canted coils springs such as are available from Bal Seal Engineering Co. of Santa Ana, Calif. Preferably, the spring contacts are made from electrically conductive spring-like materials, such as beryllium copper, and respective portions of individual coils are plated with gold or other noble metals.

With further reference to FIGS. 3–6, the canted and spring contacts 11 have a substantially elliptical cross-section including a major axis 12. In a preferred embodiment, the dimension of the canted coil spring contact 11 is 0.030 inch. Preferably, but not necessarily, the spring contact 11 is compressed in a direction which is perpendicular to the major axis of its elliptical cross-section.

The connector 10 is disposed between PC boards 13 and 14 (or other electrical assemblies) have circuit elements 15 and 16, respectively.

With reference again to FIG. 2, a sheet or strip 17 (shown in broken lines) is fed into a progressive punch or blanking die to produce the successive rows of substantially U-shaped lanced-out tabs 18. The progressive blanking die, being conventional, has been omitted for ease of illustration. The material of the sheet is flexible and relatively-thin so that not much pressure is required to stamp out the strip 17. However, the material is also somewhat brittle and hence may be stamped out in a high-speed operation while maintaining structural integrity of the part being produced.

The mounting holes 19 are stamped out along with the alignment holes 20. The mounting holes 19 facilitate clamping the connector 10 between its cooperative electrical members (such as PC boards 13 and 14) and the alignment holes 20 are used in the further processing of the strip 17. The connector 10 has fore and aft cut-out pilot surfaces 21 and 22, respectively, which are stamped out simultaneously to maintain balance on the strip 17 being processed. Thereafter, the side cut-out pilot surfaces 23 and 24 are blanked out of the strip 17. The pilot surfaces 21-24, respectively, correspond to "dummy" stations and assure proper alignment during processing of the strip 17 resulting in the connector 10. Successive rows of the substantially U-shaped tabs are produced, as the strip 17 is fed into the blanking die. The number of rows, the number of tabs 18 per row, and the overall arrangement of the rows and tabs may be changed fairly conveniently to accommodate the particular desired configuration of the connector 10, thereby providing a desired degree of production engineering flexibility.

With reference to FIGS. 7-16, the sheet or strip 17 (of the plastic material) is fed into an apparatus 25 for loading the spring contacts 11 on to the respective tabs 18.

Figure 8:
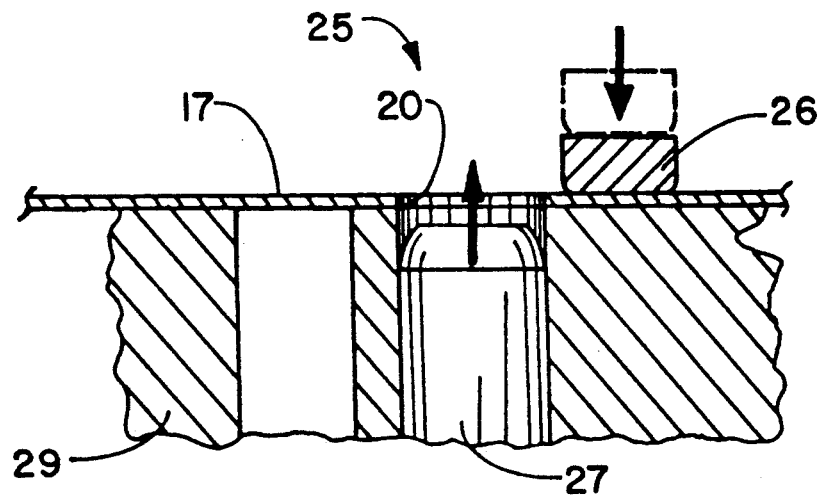
FIGS. 8–16 are schematic sequence views showing the method in which a spring contact is inserted on a respective tab on a connector.
Figure 9:
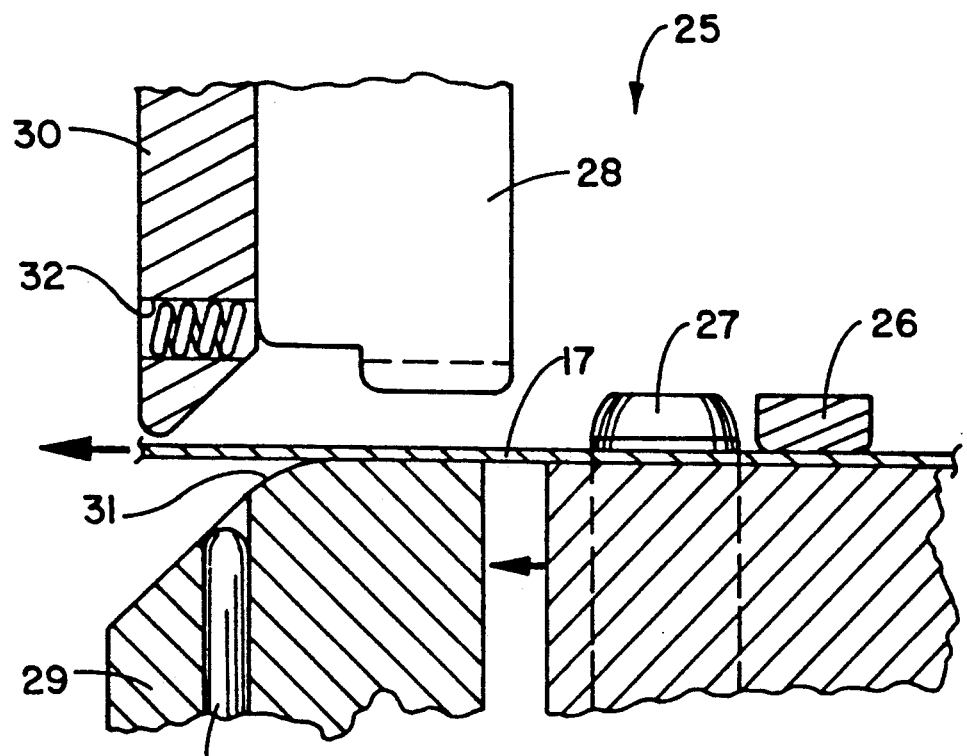
Figure 10:
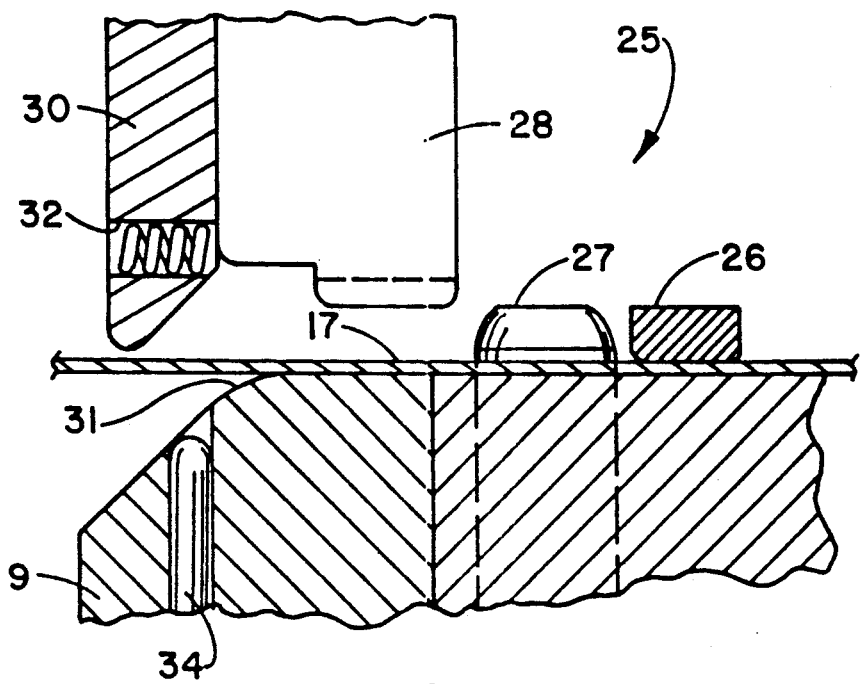

In FIG. 8, the strip 17 is clamped by a sheet clamp 26, and a pair of feed control pins 27 (one of which is shown in FIG. 9) are received in the respective alignment holes 20 in the strip 17.

Figure 11:
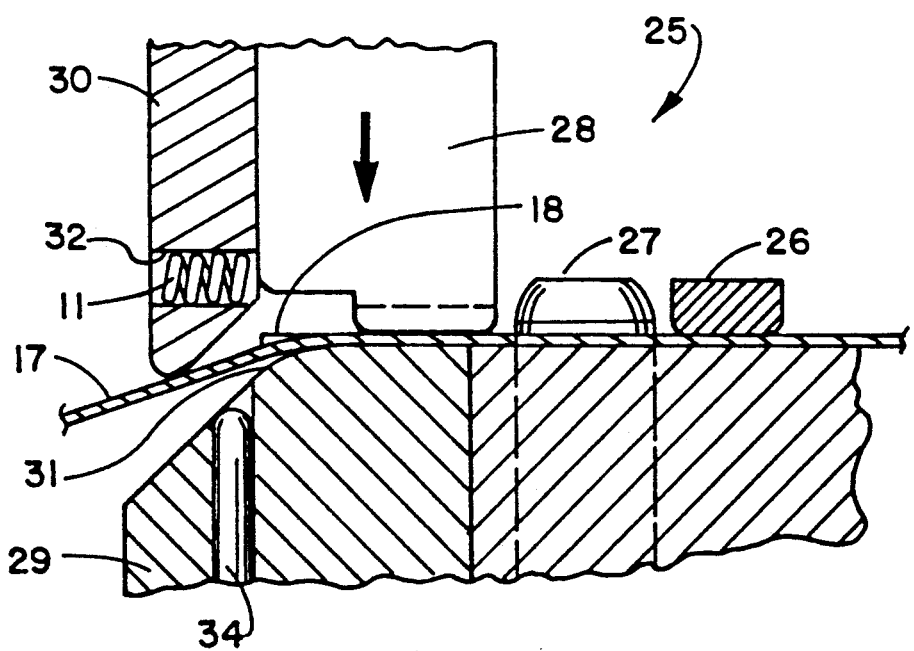
Figure 12:
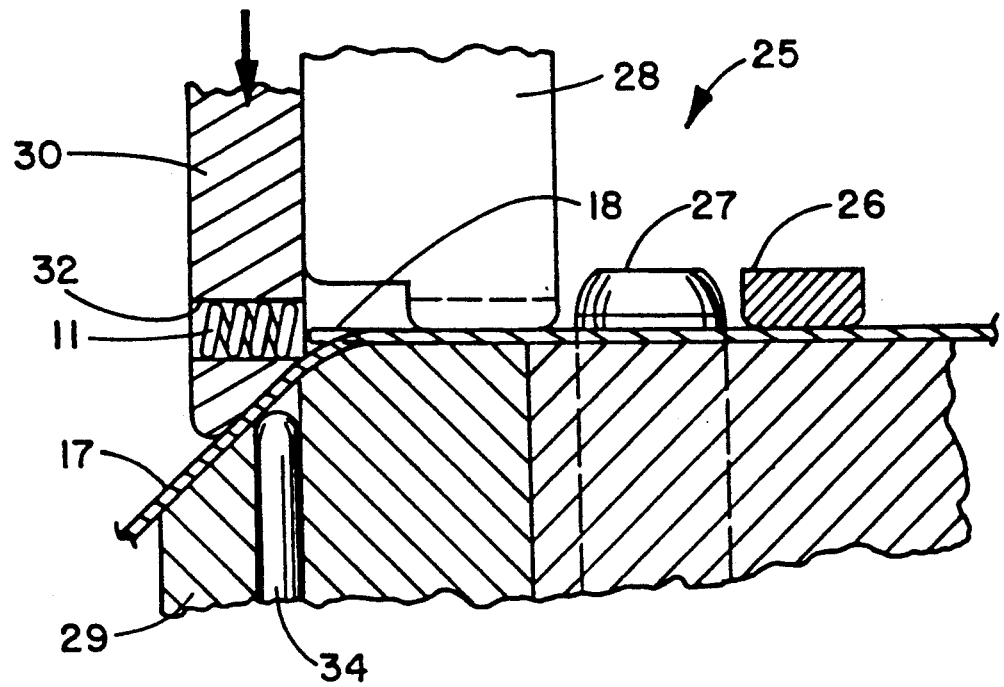

The strip 17 is advanced, preferably by 0.050 inch, into a loading station (FIG. 10) including a movable clamp 28 which comes down and clamps the strip 17 against a stationary clamp or fixture 29 (FIG. 11). A ram 30 carried by the movable clamp 28 moves downwardly (relative to the movable clamp 28) and pushes the strip 17 against a radiused surface 31, thereby deflecting the strip 17 away from the tab 18 (FIG. 11) such that the tab 17 maintains its normal position (FIG. 12).

The ram 30 has a hole 32 formed therein, and a respective spring contact 11 is loaded in the hole 32 in the ram 31. In a preferred embodiment, the hole 32 has an elliptical cross-section of 0.031 inch, nominally, to receive the contact spring 11. The spring 11, in turn, has a major axis 12 of 0.030 inch so that, nominally, there is a gap of 0.0005 inch between the spring 11 and the hole 32. The hole 32 is formed in the ram 30 by EDM or other suitable methods.

Figure 13:
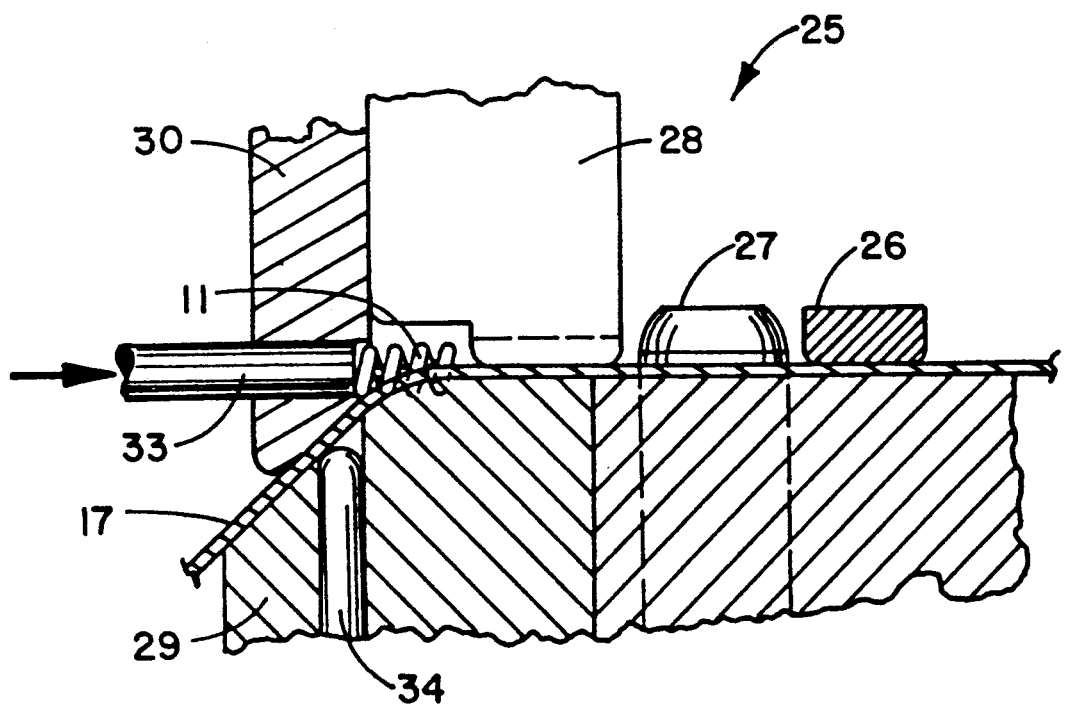
Figure 14:
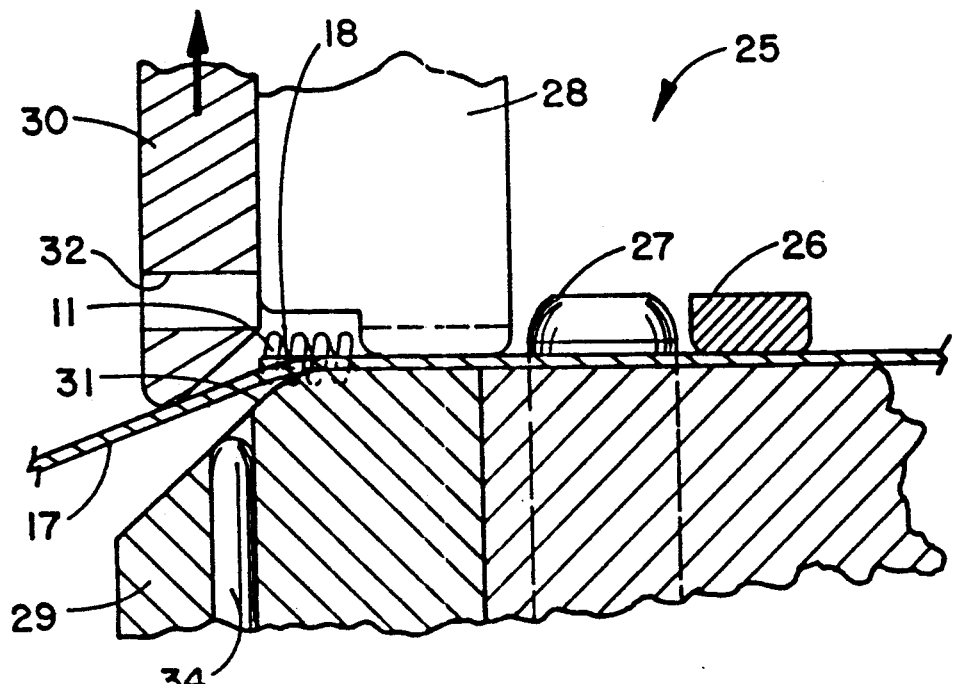

As shown in FIG. 13, the spring contact 11 (carried by the ram 30) is aligned with the tab 18 on the strip 17, and a pusher rod 33 pushes the spring contact 11 out of the hole 32 in the ram 30 and on to the tab 18, thereby loading the spring contact 11 on the tab 18.

Figure 15:
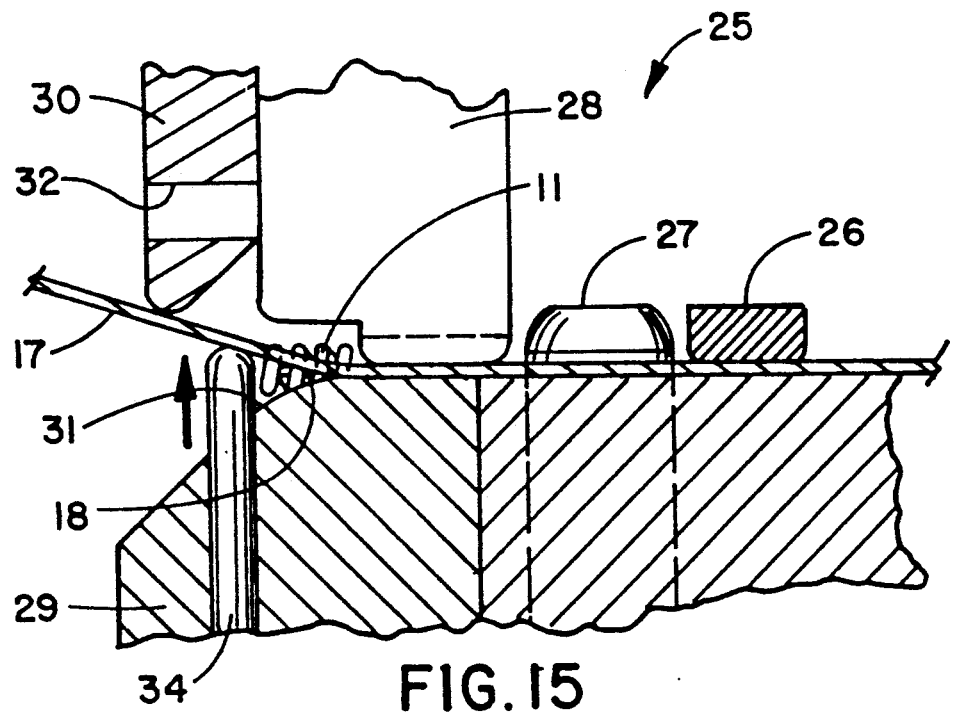

Thereafter, the ram 30 retracts (moves upwardly) away from the loading operation (FIG. 14) and a sheet-lifting pusher rod 34 (carried by the stationary clamp 29 and movable relative thereto) moves upwardly to over-bend the strip 17 (FIG. 15). While the strip 17 has some plastic "memory" and will eventually assume its original flat shape, the overbending of the strip 17 (FIG. 15) assists in having the strip 17 assume its flat or planar form. The tab 18, with its spring contact 11, is substantially within the plane of the strip 17.

Figure 16:
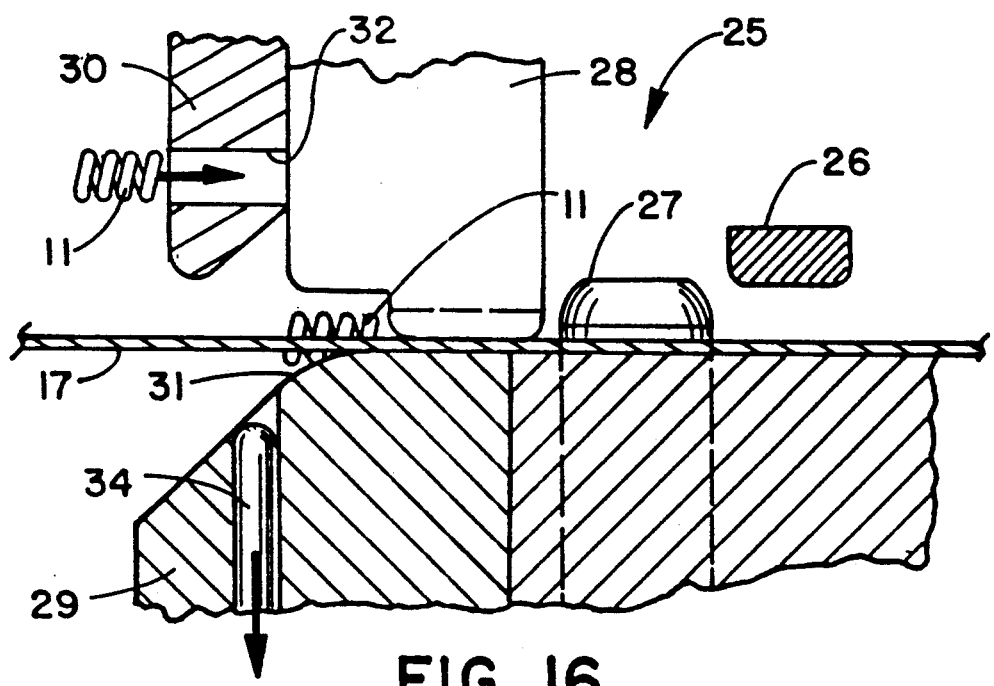

As shown in FIG. 16, the sheet-lifting pusher rod 34 retracts (moves downwardly) and a "new" spring contact 11 is inserted into the hole 32 in the ram 30. Preferably, the spring contact 11 is part of a continuous coil (not shown) and after the spring contact 11 is inserted into the hole 32, the spring contact 11 is cut off from the coil by a pair of blades coming in from the side and using a spark cut-off process. This cut-off process (being conventional) has been omitted for ease of illustration.

While the apparatus 25 has been described with reference to a single spring contact 11 and its cooperating respective tab 18, it will be understood that an entire row of contact springs 11 is loaded on to an entire row of respective tabs 18 on the strip 17.

Figure 17:
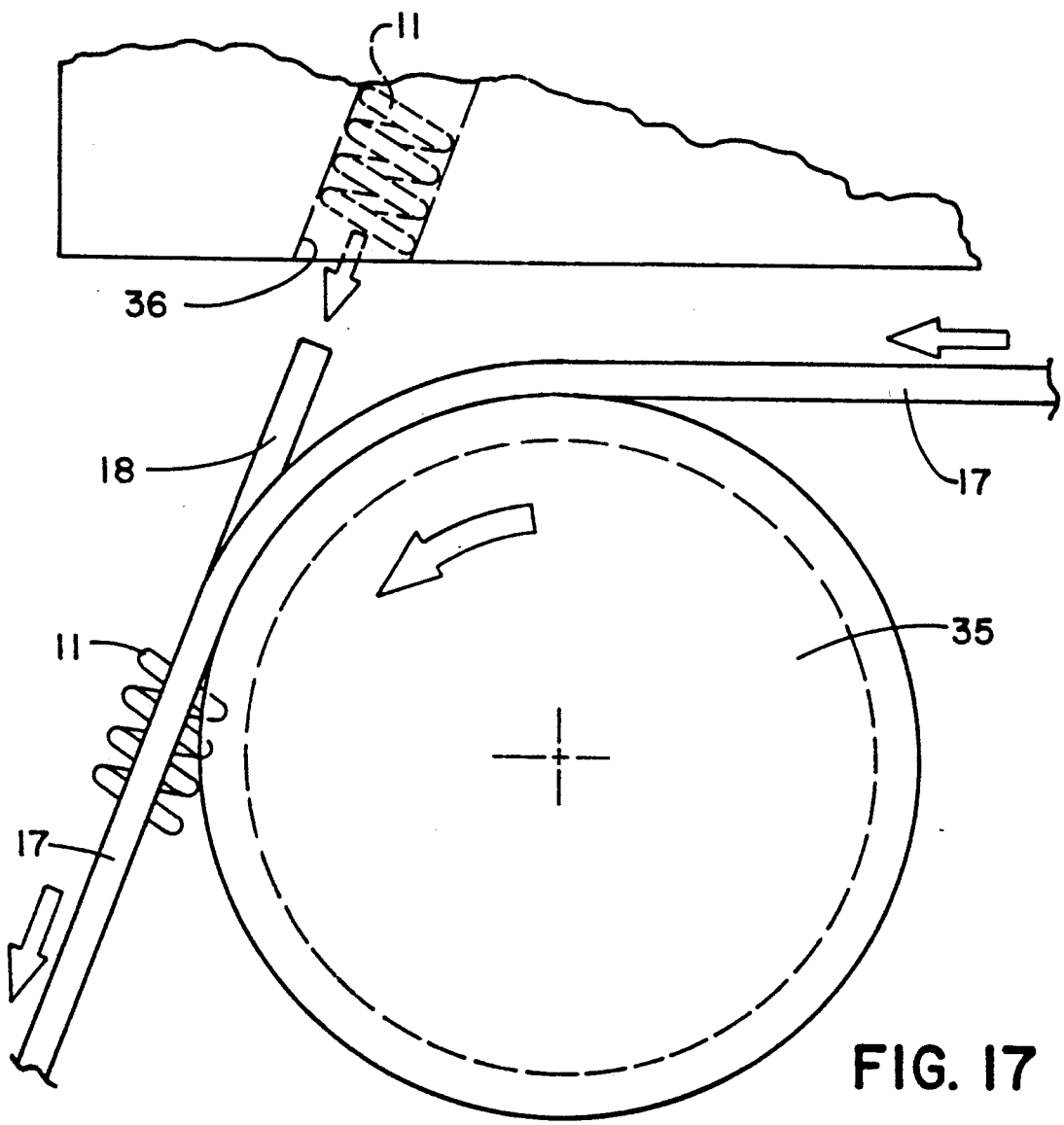
FIG. 17 is a side elevation of an alternate embodiment of the apparatus for inserting a spring contact on its respective tab, wherein the tab is pushed away from the sheet.

With reference to FIG. 17, an alternate apparatus 35 is shown for loading the spring contacts 11 on to the respective tabs 18.

The strip 17 is passed over a rotating cylinder 35 and, being flexible, follows the radiused surface of the cylinder 35 to lift the tab 18 away from the sheet 17. The spring contact 11 is in a feed chute 36 and is mounted upon the tab 18. Thereafter, the sheet 17 is indexed and the process is repeated.

Obviously, many modifications may be made without departing from the basic spirit of the present invention. Accordingly, it will be appreciated by those skilled in the art that, within the scope of the appended claims, the invention may be practiced other than has been specifically described herein.

What is claimed is:

1. A canted coil spring array for making electrical connections between respective cooperating circuit elements on a pair of spaced-apart members, comprising a thin flexible plastic sheet intended to be disposed between the spaced-apart member, a plurality of substantially U-shaped tabs formed on the sheet, and a plurality of canted coil springs mounted on the tabs, whereby each said tab is slidably received within a corresponding canted coil spring.

2. The canted coil spring array of claim 1, wherein each coil spring has a substantially elliptical cross-section including a major axis disposed substantially in the plane of its respective tab, such that the respective coil springs are compressed between the pair of members to make an electrical connection between the respective cooperating circuit elements thereon.

3. The canted coil spring array of claim 1, wherein the plastic sheet has a thickness in the range of approximately 0.005 to 0.008 inches.

* * * * *